United States Patent [19]

Summers

[11] Patent Number: 5,105,160

[45] Date of Patent: Apr. 14, 1992

[54] PHASE COMPARATOR USING DIGITAL AND ANALOGUE PHASE DETECTORS

[75] Inventor: Christopher P. Summers, London, England

[73] Assignee: U.S. Philips Corporation, New York, N.Y.

[21] Appl. No.: 494,034

[22] Filed: Mar. 14, 1990

[30] Foreign Application Priority Data

Mar. 22, 1989 [GB] United Kingdom ............... 8906585

[51] Int. Cl.⁵ ..................... H03K 9/06; H03D 13/00
[52] U.S. Cl. ................................. 328/133; 328/155; 307/262; 307/511; 331/25
[58] Field of Search ............ 307/262, 511, 514; 328/55, 155, 133, 134; 331/1 A, 25

[56] References Cited

U.S. PATENT DOCUMENTS

| | | | |
|---|---|---|---|
| 4,107,623 | 8/1978 | Graf et al. | 331/1 A |
| 4,246,497 | 1/1981 | Lawson et al. | 328/133 |
| 4,523,150 | 6/1985 | Hogeboom | 328/55 |
| 4,639,680 | 1/1987 | Nelson | 328/134 |
| 4,772,843 | 9/1988 | Asaka et al. | 328/129.1 |
| 4,884,040 | 11/1989 | Fling | 328/133 |

FOREIGN PATENT DOCUMENTS 0199448 10/1986 European Pat. Off. .

OTHER PUBLICATIONS

IBM Technical Disclosure Bulletin, "Variable Frequency Oscillator Using A Frequency Discriminator", J. W. Rae and D. P. Swart, vol. 27, No. 1A, Jun. 1984.

*Primary Examiner*—Timothy P. Callahan
*Attorney, Agent, or Firm*—William Squire

[57] ABSTRACT

A digital phase detector circuit has an up/down counter for counting clock pulses (CPS) to determine the number of clock pulses that occur in the time interval between opposite edges of a first signal (VSC) and one edge of a reference signal (PL) synchronized with the clock pulses (CPS). A latch provides a first digital output signal (DES) which represents the number. The phase detector also has an analogue phase detector circuit having a flip-flop for producing a second signal (VCS') which corresponds to the first signal (VCS) and is synchronized with the clock pulses (CPS). Logic gates and determine the time intervals between corresponding edges of the first and second signals (VCS,VCS'), and a circuit element determines a phase error voltage (VS) from these time intervals. The voltage (VS) is digitized to provide a second digital output signal (AES). The first and second digital output signals (DES,AES) are combined to produce a resultant digital output signal (DPE) which represents an overall indication of phase difference.

15 Claims, 4 Drawing Sheets

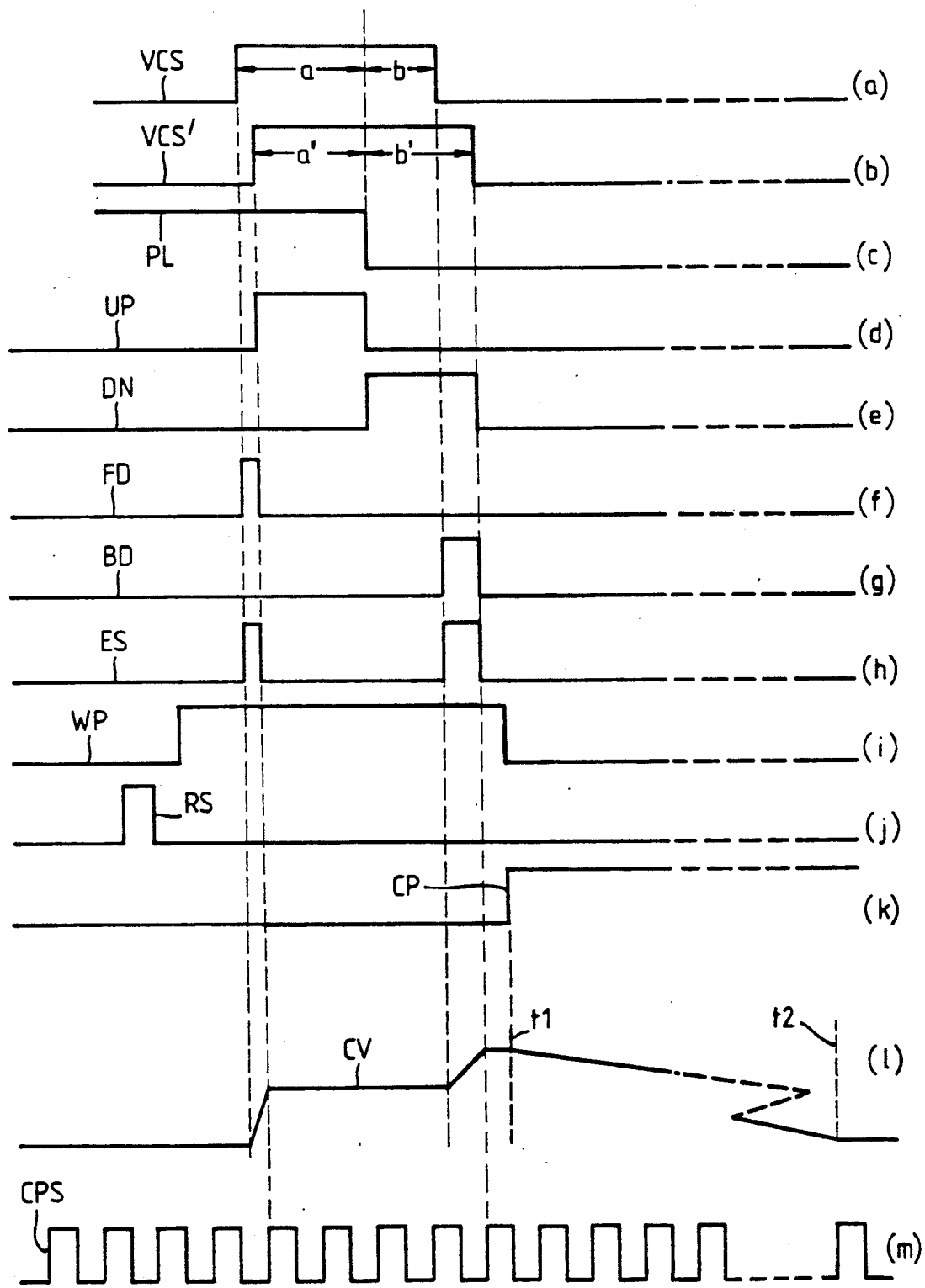

PHASE COMPARATOR USING DIGITAL AND ANALOGUE PHASE DETECTORS

FIELD OF THE INVENTION

This invention relates to phase detectors for detecting the phase difference between two signals and for providing an indication of the phase difference.

BACKGROUND OF THE INVENTION

Phase detectors have a particular but non-exclusive application in phase lock loops to detect periodically the phase difference between a received (externally generated) signal and a reference signal and to produce a correction signal which is used to control the frequency of an oscillator producing, a clockpulse signal with which the reference signal is synchronized, so as to bring the clock pulse signal into phase, or into a predetermined phase relationship, with the received signal.

Both digital and analogue phase detectors are known in the art for performing such phase detection. In a digital phase detector, the phase difference can be determined as a measure of the number of clock pulses that occur in the period of the received signal. However, this has the disadvantage that the resolution, that is the accuracy, with which the phase difference can be determined depends on the frequency of the clock pulses used. For example, a resolution of 5 ns will require a clock pulse frequency of 1/5 ns = 200 MHz. In order to provide the same resolution with an analogue phase detector, there is the disadvantage that the range of phase detector output also has to be taken into account. Thus, for phase detection in respect of separated synchronizing pulse signals of period 4.7 $\mu$s which occur at line frequency ($H_L = 15,625$ Hz) in standard 625-line television systems, the range of phase detector output would need to be 64 $\mu$s(1/$H_L$) or $\pm 32$ $\mu$s. Therefore, an analogue phase detector would have to have good stability and low noise characteristics over a dynamic range of (64 $\mu$s ÷ 5 ns = 12,800: 1).

SUMMARY OF THE INVENTION

It is an object of the present invention to provide an improved phase detector in which these disadvantages are mitigated.

According to the present invention, a phase detector comprises: a digital phase detector circuit having means for receiving a clock pulse signal, means for determining the number of clock pulses that occur in the time interval between the center (or other intermediate position) of opposite edges of a first signal and one edge of a reference signal synchronized with the clock pulse signal, and means for providing a first digital output signal which represents that number; and an analogue phase detector circuit including means for producing a second signal which corresponds to the first signal and is synchronized with the clock pulse signal, means for determining the time intervals between corresponding edges of the first and second signals, means for determining a phase error voltage from these time intervals, and means for digitizing the voltage to provide a second digital output signal; the phase detector further comprising means for combining said first and second digital output signals to produce a resultant digital output signal which represents an overall indication of phase difference.

In a phase detector according to the invention the first digital output signal from the digital detector circuit represents a coarse resolution of one or more clock periods and the second digital output signal from the analogue detector circuit represents a fine resolution of less than one clock period. The actual value of the fine resolution depends on the accuracy with which the voltage that represents it can be digitized.

Thus, the use of a digital phase detector with a relatively slow clock which on its own would give only a poor resolution is compensated for by the provision of the analogue phase detector which refines the resolution to an acceptable value. The analogue detector is required to operate over only a limited dynamic range, of for instance 2 × 1/f$\eta$ ÷ 5 ns = 67: 1, if f$\eta$ is a 6 MHz clock, for example discussed previously.

One specific form of digital phase detector circuit which is contemplated for the performance of the invention comprises an up/down counter having an 'enable' input to which the first signal is to be applied, a 'clock' input to which the clock pulse signal is to be applied, an 'up/down count' input to which a reference signal synchronized with the clock pulse signal is to be applied, together with output means operable for each occurrence of the first signal to output the count attained by the counter as the first digital output signal.

One specific form of analogue detector circuit which is contemplated for the performance of the invention comprises a capacitor, first means for controlling the charging of the capacitor by a first current of value I during the time intervals between corresponding edges of the first and second signals to produce the phase error voltage across the capacitor, second means for controlling the discharging of the capacitor by a second current of value I/n until the voltage across it reaches a null value, and further means for controlling the number of clock pulses that occur in the clock pulse signal in the discharge period for the capacitor, to provide this latter count as the second digital output signal.

This form of analogue detector circuit thus provides a resolution of 1/n times the clock period. If the current sources are linear and no overloading occurs, the accuracy of operation depends only on the ratio of the two currents, not on their absolute values, nor on the capacitor value.

BRIEF DESCRIPTION OF THE DRAWING

In order that the invention may be more fully understood, reference will now be made by way of example to the accompanying drawings, of which:

FIGS. 3 and 4 show explanatory waveforms;

DESCRIPTION OF THE PREFFERED EMBODIMENT

Figure 1:
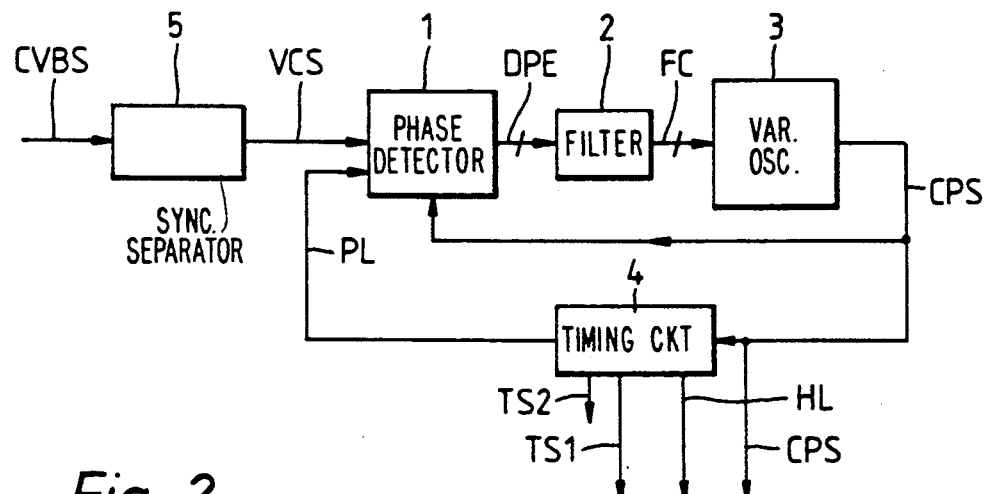
FIG. 1 is a block diagram of a phase lock loop arrangment in which a phase detector according to the present invention is embodied.

Referring to the drawing, the phase lock loop arrangment shown in FIG. 1 is adapted to provide synchronization of internally generated clock pulse and timing signals for a video display, with synchronising pulses present in an applied composite video waveform. To acheive this synchronization, the arrangement is operable to lock a variable frequency oscillator to sync. pulses which occur periodically in the composite video waveform. This phase lock loop arrangement comprises a phase derector 1, a loop filter 2, a variable frequency digital oscillator 3, and a timing circuit 4. Asynchronous separated sync. pulse signals VCS are applied to one input of the phase detector 1 from a sync. separator 5 which separates the sync. pulses from a composite video waveform CVBS. It is assumed for the purpose of the present description that the composite video waveform CVBS is a standard 625-line PAL television signal, and it is further assumed that the separated sync. pulses are the line sync. pulses which occur at a line frequency of 15,625 Hz. This gives a line period of 64 µs and the period of the sync. pulse in the sync. pulse signal VCS at the beginning of each line period is approximately 4.7 µs.

The phase detector 1 also has applied to it a phase-locking reference pulse signal PL which is supplied by the timing circuit 4. The phase detector 1 is operable to produce a digital phase error signal DPE which signifies the phase error between the incoming sync. pulse signal VCS and the reference pulse signal PL. Following adjustment by the loop filter 2, the error signal DPE is reproduced as a digital frequency control signal FC which is used to adjust the frequency of the oscillator 3 which produces a clock pulse signal CPS which controls the timing of the reference pulse signal PL and also other timing signals, HL, TS1, TS2, etc., which are produced by the timing circuit 4. The effect of this inter alia is to move the pulse signal PL into a required phase relationship with the incoming sync. pulse signal VCS such that the clock pulse signal CPS becomes synchronous with the incoming sync. pulse signal VCS. Assuming that clock pulse signal CPS produced by the oscillator 3 is a 6 MHz signal, then the timing circuit 4 is required to divide this signal by 384 to produce the reference pulse signal PL at the line frequency of 15625 Hz. The relationship between the pulse VCS and PL is represented by the waveforms (a) and (c) in FIG. 3 to which reference will be made in detail later. The clock pulse signal CPS is represented by the waveform (m) in FIG. 3.

Figure 2:
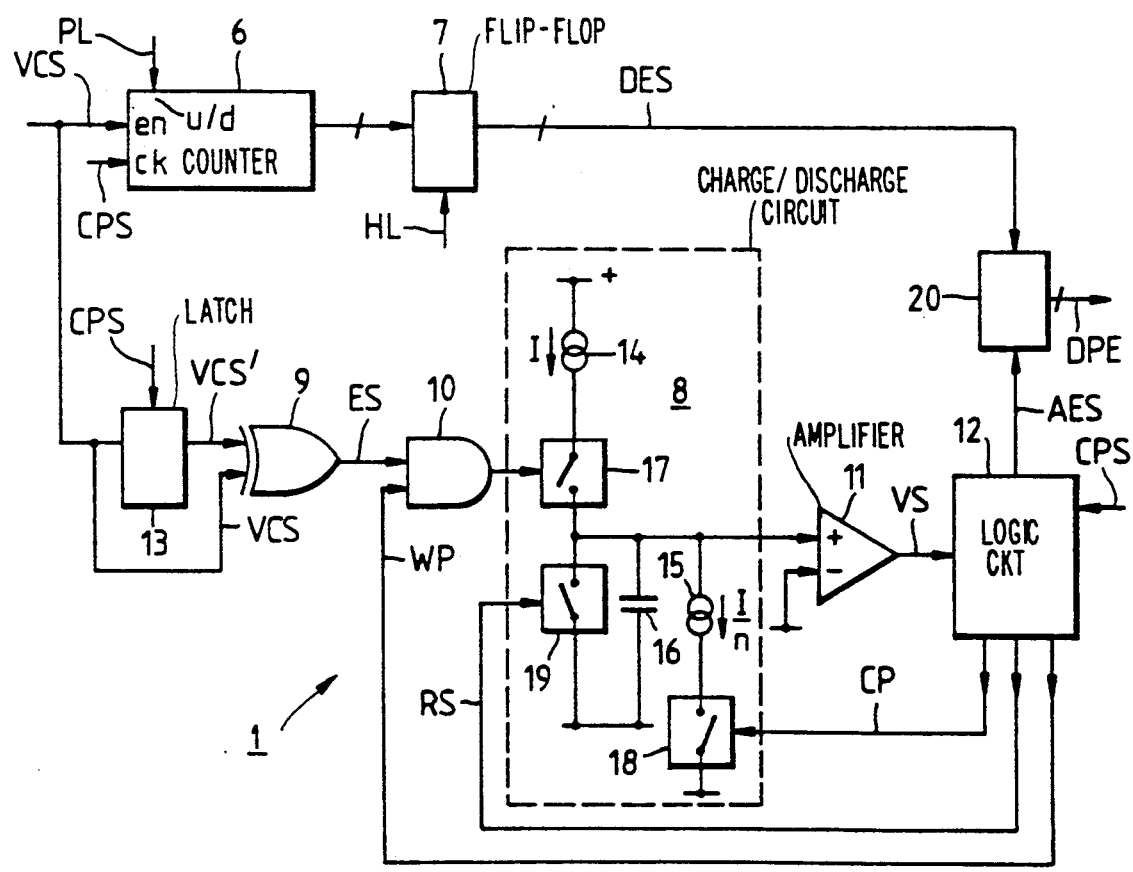
FIG. 2 is a block diagram of a phase detector according to the invention.

In accordance with the present invention, the phase detector 1 is implemented as the combination of a digital phase detector circuit and an analogue phase detector circuit, and a particular embodiment thereof is shown in FIG. 2. The digital phase dector circuit comprises an up/down counter 6 having an enable input en to which the separated sync. pulse signal VCS is applied, an up/down input u/d to which the phase-locking pulse signal PL is applied, and a clock input ck to which the clock pulse signal CPS is applied. The output from the counter 6 is clocked at the line frequency by a signal HL via a D-type flip-flop 7, so as to provide a digital error signal DES for each line period. Once the sync. pulse signal VCS has enabled the counter 6, the counter will count "up" in response to the clock pulse signal CPS during the time that the reference pulse signal PL has one logic value, and then count "down" in response to the clock pulse signal CPS after the reference pulse signal PL has assumed the opposite logic value. The waveforms (d) and (e) in FIG. 3 represent the time intervals UP and DN of these digital "up" and "down" counts, respectively.

The analogue phase detector circuit comprises a capacitor charge/discharge circuit 8, an exclusive-OR gate 9, an AND-gate 10, a voltage amplifer 11, a control and timing logic circuit 12, and a latch 13. The signal VCS is applied to the latch 13 which is set by the clock pulse signal CPS so as to produce a clocked sync. pulse signal VCS' which is represented by the waveform diagram (b) in FIG. 3.

It can be seen from the waveforms (a) to (c) in FIG. 3, that the true phase error between the signal VCS and VCS' may be represented as follows:

$$\begin{aligned}
\text{true phase error} &= a - b \\
&= a - b + a' - b' - a' + b' \\
&= (a' - b') + (a - a') + (b' - b) \\
&= \text{digital phase error} + \\
&\quad \text{front delay} + \text{back delay} \\
&= \text{"digital" phase error} + \\
&\quad \text{"analogue" phase error}
\end{aligned}$$

Waveforms (f) and (g) represent the analogue front and back delays FD, BD, respectively.

Because the clock pulse signal CPS is a 6 MHz signal, the resolution of the digital phase detector circuit to within one clock pulse, that is when the loop is phase-locked, is 1/6 MHz = 167 ns. The 'digital' phase error at any time is one or more clock pulse periods and can be considered as a coarse resolution which is represented by the digital error signal DES. The detection of further phase error to improve the resolution to less than one clock pulse period to achieve a fine resolution to within 5 ns is effected by the analogue phase detector circuit of the phase detector.

The two signals VCS and VCS' are applied to the exclusive-OR gate 9 which produces an error pulse signal ES which is represented by the waveform (h) in FIG. 3 and is composed of the front and back delays FD, BD represented by the waveforms (f) and (g). The error pulse signal ES is applied to one input of the AND-gate 10 which has a windoww pulse WP applied to its other input from the circuit 12. This window pulse WP is represented by the waveform (i) in FIG. 3 and defines a window period during which the separated sync. signals VCS is expected to occur in each television line period. The output signal from the gate 10 is applied to the charge/discharge circuit 8.

Circuit 8 comprises a first current source 14 which supplies a current I, a second current source 15 which supplies a current I/n, a capacitor 16, and three electronic switches 17, 18 and 19. All these items which comprises the circuit 8 can be implemented in any suitable known manner. Before the occurrence of each window pulse WP, a reset pulse RS (see waveform (j) of FIG. 3) from the circuit 12 operates the switch 19 for a short period to complete a rapid discharge path for the capacitor 16. The output signal from the gate 10 subsequently operates the switch 17 (twice) to complete a charge path for the capacitor 16 to the current source 14. After the termination of the window pulse WP, the circuit 12 supplies a control pulse signal CP (see waveform (k) of FIG. 3) which operates switch 18 to complete a controlled discharge path for the capacitor 16 to the current source 15.

The charge on the capacitor 16 due to the output signal from the gate 10 is directly proportional to the total of the widths of the two pulses in the waveform (h) and thus directly proportional to the "analogue" phase error. The capacitor voltage CV due to the charge on the capacitor 16 is represented by the waveform (1) of FIG. 3. The control circuit 12 provides a digital error signal AES which represents this charge, by allowing the capacitor 16 to discharge slowly through the current source 15 at the reduced current I/n and using the clock pulse signal CPS to count the discharge time from the charged level of the capacitor at time t1 to a time t2 when the capacitor has completely discharged. A voltage signal VS applied from the voltage amplifier 11 to the control circuit 12 signifies the time interval for which the capacitor is charged. The resolution afforded by the analogue phase detector is therefore the clock pulse period divided by n, so that making n=32 gives a resolution of 167 ns/32=5 ns, which is the required overall resolution mentioned earlier. The two digital output signals DES and AES are added in a combining circuit 20 to form the overall digital phase error signal DPE. Because the sync. pulse signal VCS occurs only once every 64 μs, the discharge period afforded by the control pulse signal CP can, in principle, be made longer with a corresponding increase in the value n, thereby still further improving the resolution.

A phase detector according to the invention allows for the possiblility of the phase lock loop not being quite locked up and/or the extracted separated sync. pulse signal VCS being broken up into two (or more) pulses, for instance by noise, on the incoming video signal.

Figure 4:
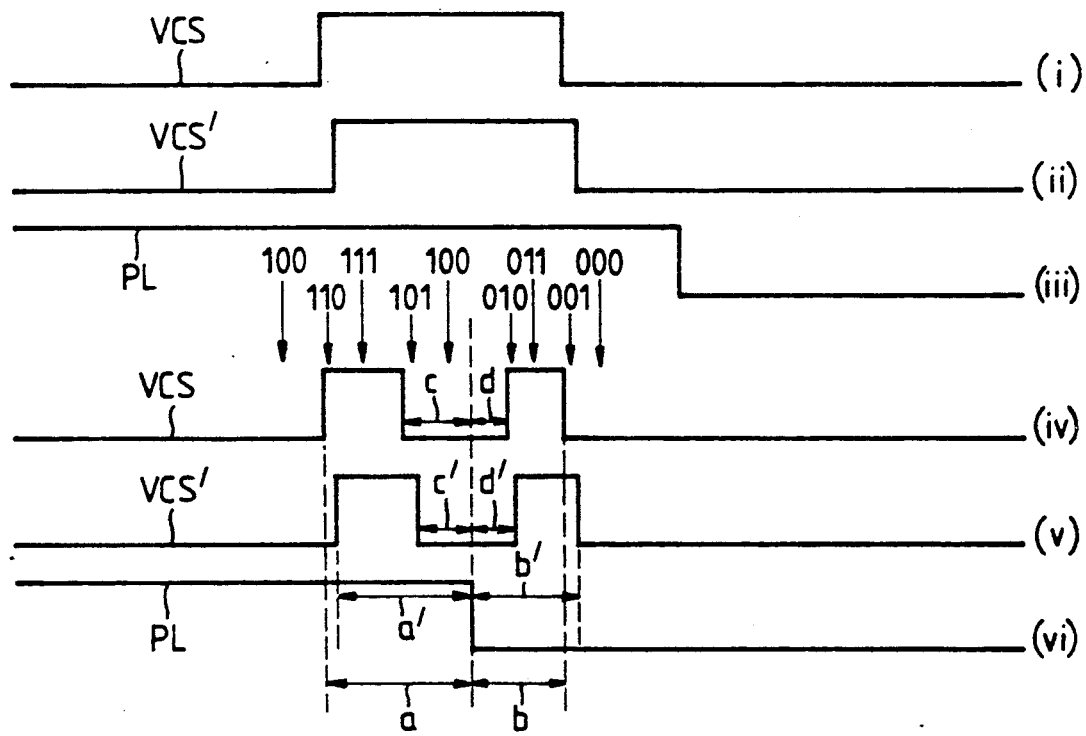

When the loop is not locked up, the edge of the reference pulse signal PL will be outside the period of the signals VCS and VCS' as shown by the waveform (i), (ii) and (iii) in FIG. 4. However, the only effect of this situation will be for the counter 6 in the digital phase detector to count up (or down) only, during the period of the separated sync. pulse signal VCS. This will provide a large value digital number DES representing a constant digitally derived phase error indication and corresponding to the number of clock pulses counted in the period of the sync. pulse signal VCS. The phase relationship between the two signals VCS and VCS' will still provide the two-pulse 'analogue' error signal ES which is used by the analogue phase detector.

When the separated sync. pulse signal VCS is broken up into a number of pulse, the clocked sync. pulse signal VCS' will be correspondingly broken up, as illustrated by waveform (iv) and (v) of FIG. 4. In this instance, in relation to the reference pulse signal PL as represented by the waveform (iv) of FIG. 4, the true phase error is $(a-c)-(b-d)$, and the "digital" phase error is $(a'-c')-(b'-d')$, because $a>a'$; $b<b'$; $c>c'$; and d d', for this relationship of the pulse signals. If it is assumed that the "analogue" phase error is again the true phase error minus the "digital" phase error then:

$$\begin{aligned}\text{"analogue" phase error} &= (a-c)-(b-d)-\\&\quad(a'-c')+(b'-d')\\&= a-c-b+d-a'+\\&\quad c'+b'-d'\\&= (a-a')+(b'-b)-\\&\quad(c-c')-(d'-d)\end{aligned}$$

where each of these four terms is positive.

Figure 5:
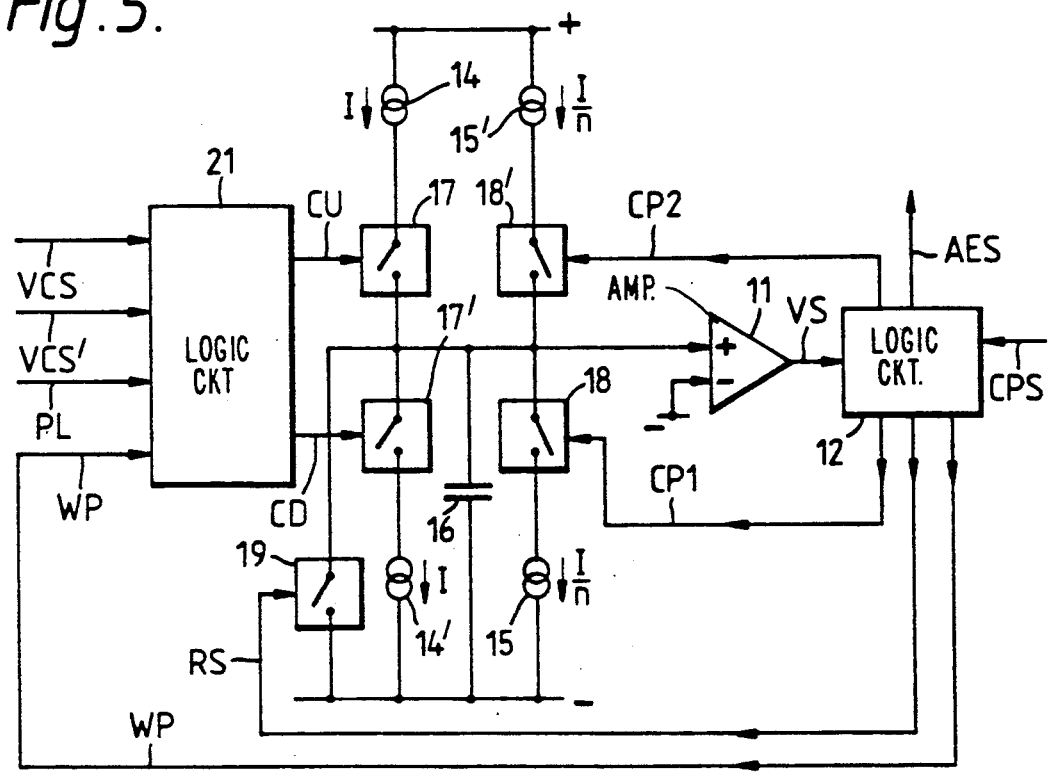
FIG. 5 is a block diagram of a modification of the phase detector of FIG. 2.

The modification of the phase detector shown in FIG. 5 caters for the possible break-up of the separated sync. pulse signal VCS into a number of pulses. This modification concerns the analogue phase detector circuit and differs from the analogue phaes detector circuit of the phase detector of FIG. 2 by the addition of third and fourth current sources 14', 15' and associated electronic switches 17', 18', and the replacement of the exclusive OR-gate 9 and the AND-gate 10 by a logic circuit 21. With the analogue phase detector circuit of FIG. 2, the break-up of the signal VCS (and therefore that of the signal VCS' as well), would produce an error signal ES having a number of pairs of pulses, using the circuit of FIG. 2. The effect of this would be to overcharge the capacitor 16, thereby giving a false time interval t1−t2. The modified circuit of FIG. 5 avoids this false result by using the additional current sources to charge down as well as charge up the capacitor 16 during the period of the window pulse WP, and also to charge up as well as charge down the capacitor 16 after the window pulse WP for the measurement of the time interval t1−t2. The control necessary for these operations is achieved by the logic circuit 21 in accordance with the following logic table.

LOGIC TABLE

| | PL | VCS | VCS' | charge up C16 | charge dn C16 |
|---|---|---|---|---|---|
| 1. | 0 | 0 | 0 | 0 | 0 |
| 2. | 0 | 0 | 1 | 1 | 0 |
| 3. | 0 | 1 | 0 | 0 | 1 |
| 4. | 0 | 1 | 1 | 0 | 0 |
| 5. | 1 | 0 | 0 | 0 | 0 |
| 6. | 1 | 0 | 1 | 0 | 1 |
| 7. | 1 | 1 | 0 | 1 | 0 |
| 8. | 1 | 1 | 1 | 0 | 0 |

These eight possible logic conditions are shown in FIG. 4, from which it can be seen that for the interval between the trailing edges of the pulses VCS and VCS' charge up occurs when PL=0 and charge down occurs when PL=1. Conversely, for the interval between the leading edges of the pulses VCS and VCS' charge up occurs when PL=1 and charge down occurs when PL=0. For charge up, the logic circuit 21 produces a signal CU to operate the switch 17 and for charge down it produces a signal CD to operate the switch 17'. The timing logic circuit 12 now produces one of two control pulse signals CP1 and CP2 to operate switch 18 or 18', as the case may be, depending on the initial polarity of the voltage signal VS produced by the voltage comparator 11.

Figure 6:
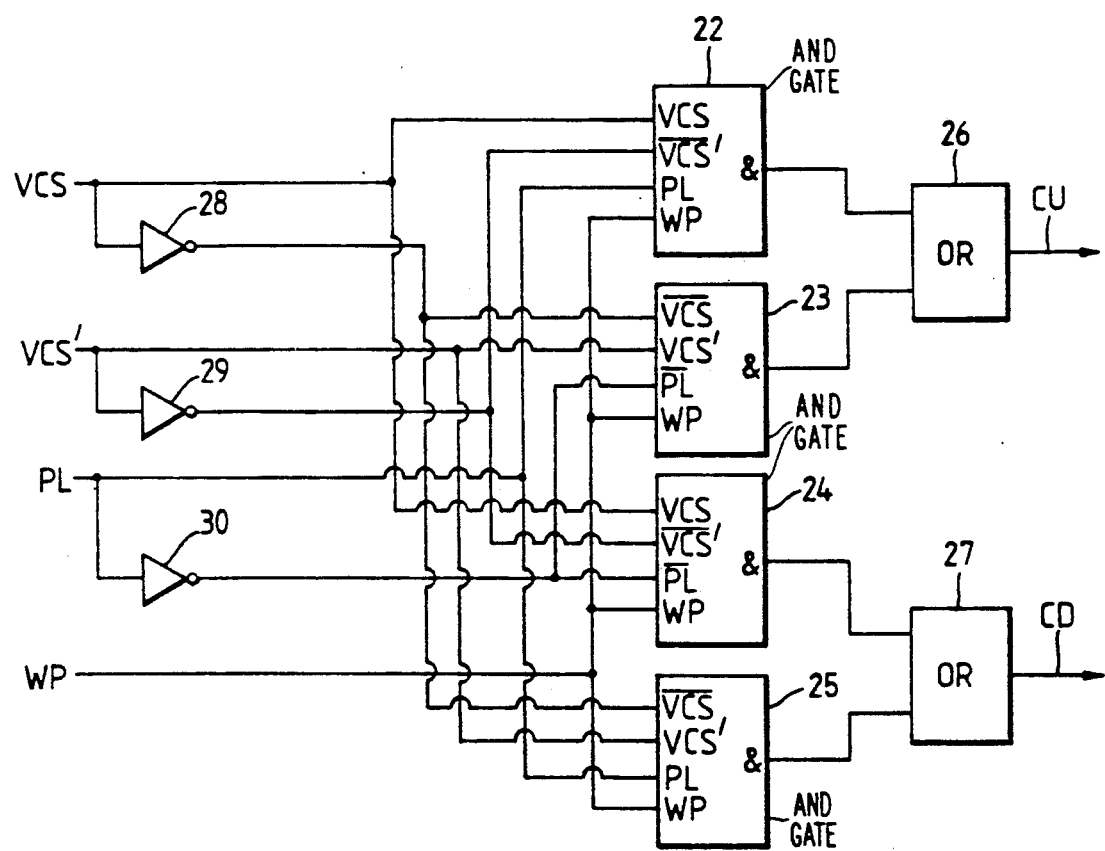
FIG. 6 is a logic circuit element for the modification of FIG. 5.

The logic circuit 21 may be implemented as shown in FIG. 6 by means of four AND-gates 22 to 25, two OR-gates 26,27, and three invertors 28 to 30.

From reading the present disclosure, other modifications will be apparent to persons skilled in the art. Such modifications may involve other features which are already known per se and which may be used instead of or in addition to features already described herein.

I claim:

1. A phase detector comprising:
   a digital phase detector circuit responsive to a first signal having opposite edges, said circuit comprising:
   means for receiving a clock pulse signal,
   means for producing a reference signal synchronized with the clock pulse signal and having at least one edge,
   means responsive to said clock pulse signal for determining the number of clock pulses that occur in the time interval-between the time of occurrence of a given position between said opposite edges of said first signal and the time of occurrence of the at least one edge of said reference signal, and means responsive to said means49 providing a first digital output signal which represents said number of clock pulses;

an analogue phase detector circuit comprising:

means responsive to said first signal for producing a second signal having opposite edges which respectively correspond to the opposite edges of said first signal and is synchronized with said clock pulse signal, means for determining the time intervals between the corresponding edges of said first and second signals, means for determining a phase error voltage from the determined time intervals, and means for digitizing said phase error voltage to provide a second digital output signal; the phase detector further comprising means for combining said first and second digital output signals to produce a resultant digital output signal which represents an overall indication of phase difference.

2. A phase detector as claimed in claim 1, where in said digital phase detector circuit comprises an up-/down counter having an 'enable' input to which said first signal is to be applied, a 'clock' input to which said clock pulse signal is to be applied, and an 'up/down count' input to which a reference signal synchronised with said clock pulse signal is to be applied, together with output means operable for each occurrence of said first signal to output the count attained by said counter as said first digital output signal.

3. A phase detector as claimed in claim 2 wherein said analogue detector circuit comprises a capacitor, first means for controlling the charging of the capacitor by a first current of value I during said time intervals between corresponding edges of said first and second signals to produce said phase error voltage across the capacitor, and second means for controlling the discharging of the capacitor by a second current of value I/n until the voltage across it reaches a null value, and further means for counting the number of clock pulses that occur in said clock pulse signal in the discharge period for the capacitor, to provide this latter count as said second digital output signal.

4. A phase detector as claimed in claim 2 wherein said second signal is produced by latching means which is connected to receive said first signal and is operable by said clock pulse signal, and in that the periods between corresponding edges of said first and second signals are represented by the output pulse signal of an exclusive-OR gate which is connected to receive said first and second signals.

5. A phase detector as claimed in claim 3 wherein said first means controls the charging of the capacitor in either a positive or a negative sense, and said second means controls the discharging of the capacitor in the opposite sense.

6. A phase detector as claimed in claim 5 wherein said second signal is produced by latching means which is connected to receive said first signal and is operable by said clock pulse signal, and in that the periods between corresponding edges of said first and second signals are represented by the output pulse signal of an exclusive-OR gate which is connected to receive said first and second signals.

7. A phase detector as claimed in claim 5 wherein said first means includes means for determining the instantaneous logic levels of said first, second and reference signals, and said second means includes means for determining the sense of the phase error voltage.

8. A phase detector as claimed in claim 7 wherein said second signal is produced by latching means which is connected to receive said first signal and is operable by said clock pulse signal, and in that the periods between corresponding edges of said first and second signals are represented by the output pulse signal, of an exclusive-OR gate which is connected to receive said first and second signals.

9. A phase detector as claimed in claim 1 or 2, wherein said analogue detector circuit comprises a capacitor, first means for controlling the charging of the capacitor by a first current of valve I during said time intervals between corresponding edges of said first and second signals to produce said phase error voltage across the capacitor, and second means for controlling the discharging of the capacitor by a second current of value I/n until the voltage across it reaches a null value, and further means for counting the number of clock pulses that occur in said clock pulse signal in the discharge period for the capacitor, to provide this latter count as said second digital output signal.

10. A phase detector as claimed in claim 9, wherein said first means controls the charging of the capacitor in either a positive or a negative sense, and said second means controls the discharging of the capacitor in the relevant opposite sense.

11. A phase detector as claimed in claim 9 wherein said second signal is produced by latching means which is connected to receive said first signal and is operable by said clock pulse signal, and in that the periods between corresponding edges of said first and second signals are represented by the output pulse signal of an exclusive-OR gate which is connected to receive said first and second signals.

12. A phase detector as claimed in claim 10 in that wherein said first means includes means for determining the instantaneous logic levels of said first, second and reference signals, and said second means includes means for determining the sense of the phase error voltage.

13. A phase detector as claimed in claim 10 wherein said second signal is produced by latching means which is connected to receive said first signal and is operable by said clock pulse signal, and in that the periods between corresponding edges of said first and second signals are represented by the output pulse signal of an exclusive-OR gate which is connected to receive said first and second signals.

14. A phase detector as claimed in claim 12 wherein said second signal is produced by latching means which is connected to receive said first signal and is operable by said clock pulse signal, and in that the periods between corresponding edges of said first and second signals are represented by the output pulse signal of an exclusive-OR gate which is connected to receive said first and second signals.

15. A phase detector as claimed in claim 1 wherein said second signal is produced by latching means which is connected to receive said first signal and is operable by said clock pulse signal, and in that the periods between corresponding edges of said first and second signals are represented by the output pulse signal of an exclusive-OR gate which is connected to receive said first and second signals.

* * * * *